United States Patent
Kim

(10) Patent No.: US 11,798,621 B2
(45) Date of Patent: Oct. 24, 2023

(54) RESISTIVE MEMORY DEVICE AND METHOD FOR READING DATA IN THE RESISTIVE MEMORY DEVICE

(71) Applicant: SAMSUNG ELECTRONICS CO., LTD., Suwon-si (KR)

(72) Inventor: Chan Kyung Kim, Osan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 117 days.

(21) Appl. No.: 17/214,078

(22) Filed: Mar. 26, 2021

(65) Prior Publication Data
US 2022/0076742 A1    Mar. 10, 2022

(30) Foreign Application Priority Data
Sep. 9, 2020   (KR) .................. 10-2020-0115164

(51) Int. Cl.
*G11C 13/00*   (2006.01)
*G11C 11/16*   (2006.01)

(52) U.S. Cl.
CPC ........ *G11C 13/004* (2013.01); *G11C 11/1655* (2013.01); *G11C 11/1673* (2013.01); *G11C 13/0026* (2013.01); *G11C 13/0038* (2013.01); *G11C 2013/0045* (2013.01); *G11C 2213/79* (2013.01)

(58) Field of Classification Search
None
See application file for complete search history.

(56) References Cited

U.S. PATENT DOCUMENTS

| | | | |
|---|---|---|---|
| 5,640,343 A * | 6/1997 | Gallagher | G11C 11/1653 257/E27.005 |
| 7,570,507 B2 | 8/2009 | Nirschl | |
| 9,042,152 B2 | 5/2015 | Kim et al. | |
| 9,767,870 B1 | 9/2017 | Roy et al. | |
| 10,224,087 B1 | 3/2019 | Jung et al. | |
| 10,348,306 B2 * | 7/2019 | Gaillardon | H01L 45/1206 |
| 2004/0223393 A1 * | 11/2004 | Hush | G11C 7/065 365/207 |
| 2006/0209600 A1 * | 9/2006 | Le Phan | G11C 7/22 365/189.04 |
| 2010/0118595 A1 * | 5/2010 | Bae | G11C 13/0069 365/163 |

(Continued)

FOREIGN PATENT DOCUMENTS

| | | |
|---|---|---|
| JP | 3868699 B2 | 1/2007 |
| KR | 10-1559677 B1 | 10/2015 |

*Primary Examiner* — J. H. Hur
(74) *Attorney, Agent, or Firm* — Sughrue Mion, PLLC

(57) ABSTRACT

A resistive memory device includes a resistive memory cell, a source line connected to one end of the resistive memory cell, a bit line connected to another end of the resistive memory cell, and a sensing circuit connected to the source line and the bit line. The sensing circuit is configured to generate a pull-up signal that is pulled up from a first voltage level to a second voltage level, based on a read current flowing through the resistive memory cell, generate a pull-down signal that is pulled down from a third voltage level to a fourth voltage level, based on the read current, and determine data that is stored in the resistive memory cell, based on a difference between the generated pull-up signal and the generated pull-down signal.

15 Claims, 12 Drawing Sheets

(56) References Cited

U.S. PATENT DOCUMENTS

| | | | |
|---|---|---|---|
| 2014/0157065 A1* | 6/2014 | Ong | G06F 15/7821 |
| | | | 714/718 |
| 2014/0211544 A1* | 7/2014 | Tavallaei | G11C 13/0033 |
| | | | 365/148 |
| 2017/0345496 A1 | 11/2017 | Liu et al. | |

\* cited by examiner

MTJ = Rp , VOUTD-VOUTB>0

MTJ = Rap , VOUTD-VOUTB<0

RESISTIVE MEMORY DEVICE AND METHOD FOR READING DATA IN THE RESISTIVE MEMORY DEVICE

CROSS-REFERENCE TO RELATED APPLICATION

This application is based on and claims priority under 35 U.S.C. § 119 to Korean Patent Application No. 10-2020-0115164 filed on Sep. 9, 2020, in the Korean Intellectual Property Office, the disclosure of which is incorporated by reference herein in its entirety.

BACKGROUND

1. Field

The disclosure relates to a resistive memory device and a method for reading data in the resistive memory device.

2. Description of Related Art

A random access memory (RAM) may include a volatile memory and a nonvolatile memory. The volatile memory may lose information stored therein each time power is removed, whereas the nonvolatile memory may retain data stored therein even when power is removed from the memory.

The nonvolatile memory may include a resistive memory that stores data according to a resistance change of a memory cell. A spin torque transfer-magnetic random access memory (STT-MRAM), which is a type of the nonvolatile memory, may read data stored in a memory cell by sensing the resistance state of a magnetic tunneling junction (MTJ). To read data stored in a memory cell, various read circuits have been proposed. However, there may be many restrictions on the reading conditions of the memory cell, or the size of a memory cell array may have inevitably increased according to the characteristics of the sensing operation. Thus, research has been conducted to address this problem.

SUMMARY

Provided is a resistive memory device with improved sensing reliability while miniaturizing the memory device.

Provided is a method for reading data in a resistive memory device with improved sensing reliability while miniaturizing the memory device.

Additional aspects will be set forth in part in the description that follows and, in part, will be apparent from the description, or may be learned by practice of the presented embodiments.

According to embodiments, there is provided a resistive memory device including a resistive memory cell, a source line connected to one end of the resistive memory cell, a bit line connected to another end of the resistive memory cell, and a sensing circuit connected to the source line and the bit line. The sensing circuit is configured to generate a pull-up signal that is pulled up from a first voltage level to a second voltage level, based on a read current flowing through the resistive memory cell, generate a pull-down signal that is pulled down from a third voltage level to a fourth voltage level, based on the read current, and determine data that is stored in the resistive memory cell, based on a difference between the generated pull-up signal and the generated pull-down signal.

According to embodiments, there is provided a resistive memory device including a magnetic random access memory (MRAM) cell, a source line connected to one end of the MRAM cell, a bit line connected to another end of the MRAM cell, and a sensing circuit including a first current mirror circuit connected to the source line, and configured to mirror a read current flowing through the MRAM cell to generate a first current, and a second current mirror circuit connected to the bit line, and configured to generate mirror the read current to generate a second current. The sensing circuit is configured to determine the data that is stored in the MRAM cell, using the generated first current and the generated second current.

According to embodiments, there is provided a resistive memory device a resistive memory cell, a regulating transistor connected to one end of the resistive memory cell and to which a regulating voltage is provided, a first transistor connected between a first voltage terminal to which a first voltage is provided and the regulating transistor, a second transistor including a gate electrode connected to a gate electrode of the first transistor and to a drain of the first transistor, a first resistor connected between the second transistor and a second voltage terminal to which a second voltage less than the first voltage is provided, a third transistor connected between another end of the resistive memory cell and the second voltage terminal, a fourth transistor including a gate electrode connected to a gate electrode of the third transistor and to a drain of the third transistor, and a second resistor connected between the fourth transistor and the first voltage terminal.

According to embodiments, there is provided a method of reading data in a resistive memory device, the method including providing a resistive memory cell including one end connected to a source line and another end connected to a bit line, generating a pull-up signal that is pulled up from a first voltage level to a second voltage level, based on a read current flowing through the resistive memory cell, generating a pull-down signal that is pulled down from a third voltage level to a fourth voltage level, based on the read current, and reading data that is stored in the resistive memory cell, based on a difference between the generated pull-up signal and the generated pull-down signal.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION

Hereinafter, embodiments of the disclosure will be described with reference to the accompanying drawings.

Figure 1:
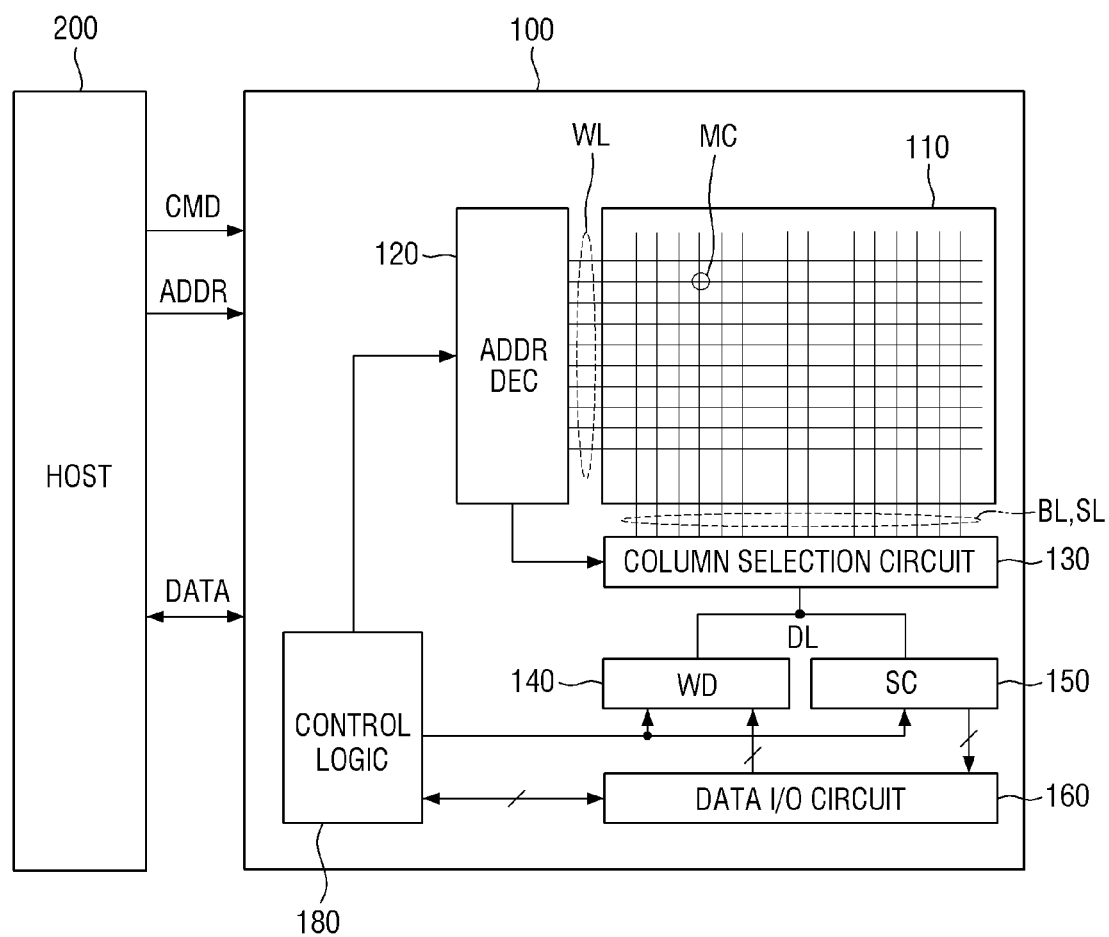
FIG. 1 is a diagram for describing a nonvolatile memory device according to embodiments.

FIG. 1 is a diagram for describing a nonvolatile memory device according to embodiments.

Referring to FIG. 1, a nonvolatile memory device 100 may read or write data in response to a request from a host 200.

The nonvolatile memory device 100 may receive a command CMD and an address ADDR from the host 200. The command CMD may include a read command, a write command, and the like. When the host 200 transmits the read command to the nonvolatile memory device 100, the nonvolatile memory device 100 may provide data read from a memory cell array 110 to the host 200.

When the host 200 transmits the write command and the data DATA to be written to the nonvolatile memory device 100, the nonvolatile memory device 100 may write the data DATA provided from the host 200 to the memory cell array 110.

The nonvolatile memory device 100 may include the memory cell array 110, an address decoder (ADDR DEC) circuit 120, a column selection circuit 130, a write driver (WD) circuit 140, a sensing circuit (SC) 150, a data input/output (I/O) circuit 160, and a control logic 180. Such a configuration is an example, and some components may be omitted or new components may be added according to an implementation purpose.

The memory cell array 110 may include a plurality of nonvolatile memory cells MC for storing data. The memory cell MC may include a variable resistance element, for example, a magnetic tunnel junction (MTJ), having a resistance value corresponding to a stored data value.

In embodiments, the nonvolatile memory device 100 may be referred to as a resistive memory device or a resistive random access memory (RRAM or ReRAM) device. For example, the memory cell array 110 of the nonvolatile memory device 100 may include a structure such as a phase change random access memory (PRAM) or a ferroelectric random access memory (FRAM), or may include a magnetic random access memory (MRAM) structure such as a spin-transfer torque magnetic random access memory (STT-MRAM), a spin torque transfer magnetization switching RAM (Spin-RAM), or a spin momentum transfer RAM (SMT-RAM).

Hereinafter, the nonvolatile memory device 100 will be described as being, for example, a resistive memory, especially MRAM, but embodiments according to the technical spirit of the disclosure are not limited thereto.

The memory cell array 110 may include one or more memory cells MC in which data is written. The memory cell array 110 may include memory cells MC disposed at points where a plurality of word lines WL and a plurality of bit lines BL cross each other. A more detailed description of such a memory cell will be described later.

In embodiments, the memory cell array 110 may include one or more sub-memory cell arrays having a predetermined number of memory cells MC. That is, a plurality of sub-memory cell arrays in which a predetermined number of memory cells MC and word lines WL, source lines SL, and bit lines BL for controlling the memory cells MC are arranged are gathered to form the illustrated memory cell array 110.

In embodiments, the sub-memory cell array may be used as a unit for reading or writing the data DATA from the host 200. In embodiments, the nonvolatile memory device 100 may write or read data in a unit of four sub-memory cell arrays (e.g., in a unit of a memory bank). However, embodiments are not limited thereto, and may be variously modified and implemented as needed.

The address decoder circuit 120 may receive the address ADDR and decode it into a row address and a column address. The address decoder circuit 120 may select one from the plurality of word lines WL according to the row address. Further, in embodiments, the address decoder circuit 120 may transfer the column address to the column selection circuit 130. For example, the address decoder circuit 120 may include components such as a row decoder, a column decoder, and an address buffer.

The column selection circuit 130 may be connected to the memory cell array 110 through the bit lines and the source lines, and may be connected to the write driver circuit 140 and the sensing circuit 150. The column selection circuit 130 may operate under the control of the control logic 180. The column selection circuit 130 may be configured to receive the decoded column address from the address decoder circuit 120.

In addition, the column selection circuit 130 may select the bit lines and the source lines using the decoded column address. For example, during a write operation, the column selection circuit 130 may connect the selected bit lines BL and source lines SL to the write driver circuit 140 by connecting them to data lines DL. During a read operation, the column selection circuit 130 may connect the selected bit lines and source lines to the sensing circuit 150.

The write driver circuit 140 may operate under the control of the control logic 180. The write driver circuit 140 may program the memory cell MC that is connected to the bit lines BL and source lines SL selected by the column selection circuit 130 and connected to the word line WL selected by the address decoder circuit 120. The write driver circuit 140 may generate a current or a voltage according to data inputted from the data input/output circuit 160, and may output the current or the voltage to the selected bit lines BL and source lines SL.

In embodiments, the write driver circuit 140 may include a local write driver for writing data to the memory cell MC included in the sub-memory cell array, and a global write driver for providing a write control signal and/or write data to the local write driver.

The sensing circuit 150 may operate under the control of the control logic 180. The sensing circuit 150 may include a read circuit for sensing the memory cell MC connected to the bit lines BL and source lines SL selected by the column selection circuit 130 and connected to the word line WL selected by the address decoder circuit 120.

The read circuit may read the memory cell MC by sensing a current flowing through the selected bit lines BL and source lines SL or a voltage applied to the selected bit lines BL and source lines SL. The sensing circuit 150 may output the read data to the data input/output circuit 160.

The data input/output circuit 160 may operate under the control of the control logic 180. The data input/output circuit 160 may transmit data inputted from the outside to the write driver circuit 140 and may output data inputted from the sensing circuit 150 to the outside.

The control logic 180 may control the overall operation of the nonvolatile memory device 100. For example, the control logic 180 may control the address decoder circuit 120, the column selection circuit 130, the write driver circuit 140, the sensing circuit 150, the data input/output circuit 160, and the like. The control logic 180 may operate in response to commands or control signals inputted from the outside.

Figure 2:
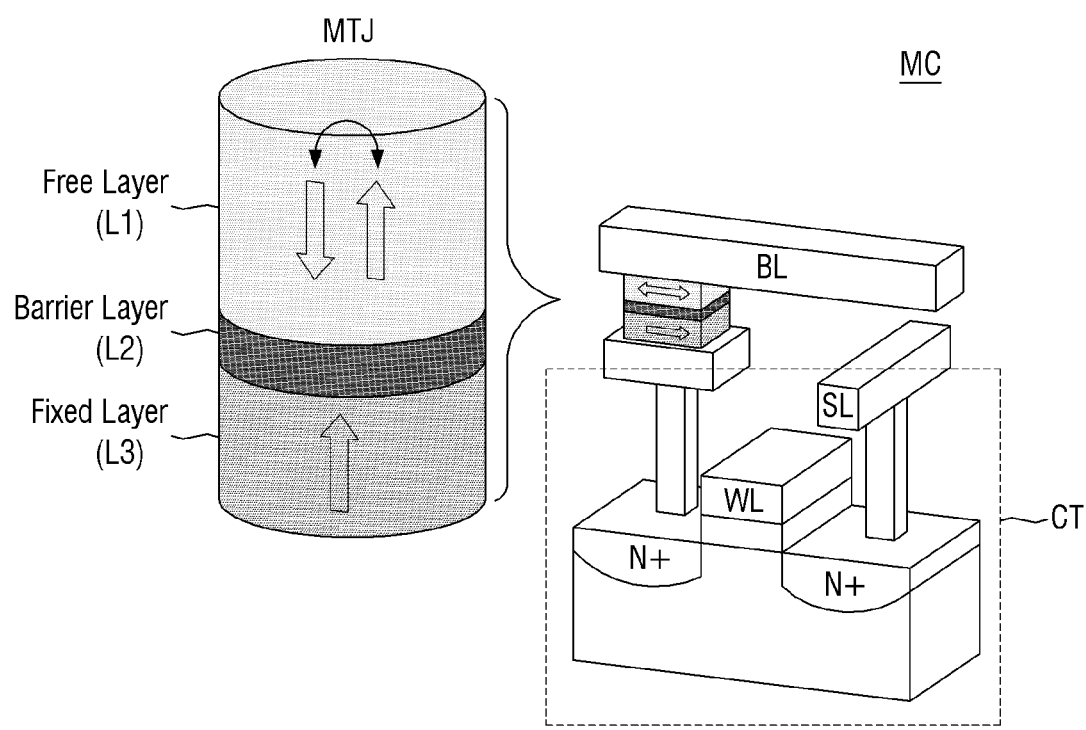
FIG. 2 is a diagram for describing a memory cell according to embodiments.
Figure 3:
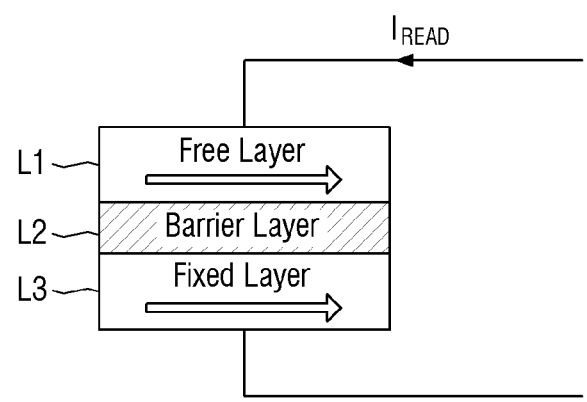
FIGS. 3 and 4 are diagrams for describing data stored according to a magnetization direction of the memory cell of FIG. 2.
Figure 4:
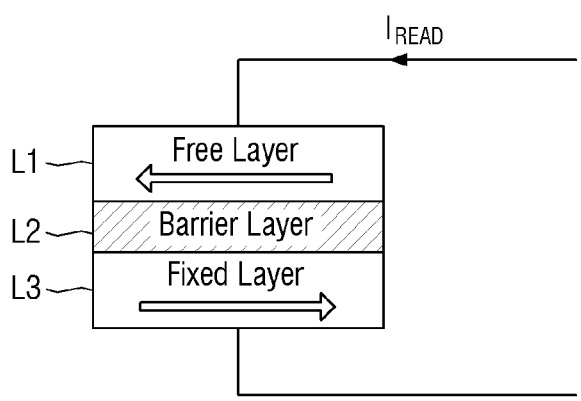

FIG. 2 is a diagram for describing a memory cell according to embodiments. FIGS. 3 and 4 are diagrams describing data stored according to a magnetization direction of the memory cell of FIG. 2.

Referring to FIG. 2, the memory cell MC may include a variable resistance element MTJ and a cell transistor CT. The gate electrode of the cell transistor CT may be connected to the word line WL. One electrode of the cell transistor CT may be connected to the bit line BL through the variable resistance element MTJ. In addition, the other electrode of the cell transistor CT may be connected to the source line SL.

In embodiments, the extension direction of the word line WL and the extension direction of the source line SL may be the same, but embodiments are not limited thereto. In other embodiments, the extension direction of the word line WL and the extension direction of the bit line BL may be perpendicular to each other, but embodiments are not limited thereto.

The variable resistance element MTJ may include a free layer L1, a fixed layer L3, and a barrier layer L2 positioned therebetween. The magnetization direction of the fixed layer L3 may be fixed, and the magnetization direction of the free layer L1 may be the same as or opposite to the magnetization direction of the fixed layer L3 depending on conditions. To fix the magnetization direction of the fixed layer L3, the variable resistance element MTJ may further include an anti-ferromagnetic layer.

In embodiments, the free layer L1 may include a material having a changeable magnetization direction. The magnetization direction of the free layer L1 may be changed by an electrical or magnetic factor provided from the outside or the inside of the memory cell MC. The free layer L1 may include a ferromagnetic material including any one or any combination of cobalt (Co), iron (Fe), or nickel (Ni). For example, the free layer L1 may include at least one selected from the group consisting of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The barrier layer L2 may have a thickness smaller than a spin diffusion distance. The barrier layer L2 may include a non-magnetic material. For example, the barrier layer L2 may include at least one selected from the group consisting of oxides of magnesium (Mg), titanium (Ti), aluminum (Al), magnesium-zinc (MgZn), and magnesium-boron (MgB), and nitrides of titanium (Ti) and vanadium (V).

The fixed layer L3 may have a magnetization direction fixed by the anti-ferromagnetic layer. In addition, the fixed layer L3 may include a ferromagnetic material. For example, the fixed layer L3 may include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

In embodiments, the anti-ferromagnetic layer may include an anti-ferromagnetic material. For example, the anti-ferromagnetic layer may include at least one selected from the group consisting of PtMn, IrMn, MnO, MnS, MnTe, $MnF_2$, $FeCl_2$, FeO, $CoCl_2$, CoO, $NiCl_2$, NiO, and Cr.

During a read operation on the memory cell MC, a voltage of a high level (e.g., logic high level) may be provided to the word line WL. At this time, the cell transistor CT may be turned on in response to the voltage of the word line WL. In addition, to measure the resistance value of the variable resistance element MTJ, a read current IREAD may be supplied in a direction from the bit line BL toward the source line SL or in a direction from the source line SL toward the bit line BL. Data stored in the variable resistance element MTJ may be determined according to the measured resistance value.

The resistance value of the variable resistance element MTJ varies depending on the magnetization direction of the free layer L1. When the read current IREAD is supplied to the variable resistance element MTJ, a data voltage according to the resistance value of the variable resistance element MTJ is outputted. Because the strength of the read current IREAD is much smaller than the strength of a write current, the magnetization direction of the free layer L1 does not change due to the read current IREAD.

Referring to FIG. 3 together, in embodiments, the magnetization direction of the free layer L1 and the magnetization direction of the fixed layer L3 in the variable resistance element MTJ may be parallel (p) to each other. In this case, the variable resistance element MTJ has a low resistance value Rp. In this case, the data may be determined as "0", for example.

In contrast, referring to FIG. 4 together, in embodiments, the magnetization direction of the free layer L1 is anti-parallel (ap) to the magnetization direction of the fixed layer L3 in the variable resistance element MTJ. In this case, the variable resistance element MTJ has a high resistance value Rap. In this case, the data may be determined as "1", for example.

In FIG. 2, the free layer L1 and the fixed layer L3 of the variable resistance element MTJ are illustrated as horizontal magnetic elements, but embodiments are not limited thereto. In other embodiments, the free layer L1 and the fixed layer L3 may be provided in the form of a vertical magnetic element.

Figure 5:
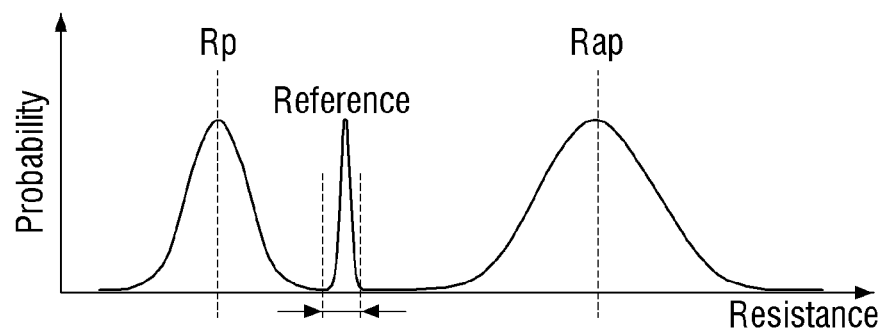
FIG. 5 is a graph describing a process of setting a reference resistance value of a memory cell according to embodiments.

FIG. 5 is a graph describing a process of setting a reference resistance value of a memory cell according to embodiments.

Referring to FIG. 5, a reference resistance value for determining data "0" and data "1" may be determined between a first resistance value Rp and a second resistance value Rap. Here, the first resistance value Rp corresponds to a resistance value of the memory cell MC when the magnetization direction of the free layer L1 of the variable resistance element MTJ is parallel (p) to the magnetization direction of the fixed layer L3 thereof. The second resistance value Rap corresponds to a resistance value of the memory cell MC when the magnetization direction of the free layer L1 of the variable resistance element MTJ is anti-parallel (ap) to the magnetization direction of the fixed layer L3 thereof. When a reference voltage or a reference current used to determine data stored in the memory cell is designed to properly reflect the reference resistance value, the data stored in the memory cell may be reliably read.

Figure 6:
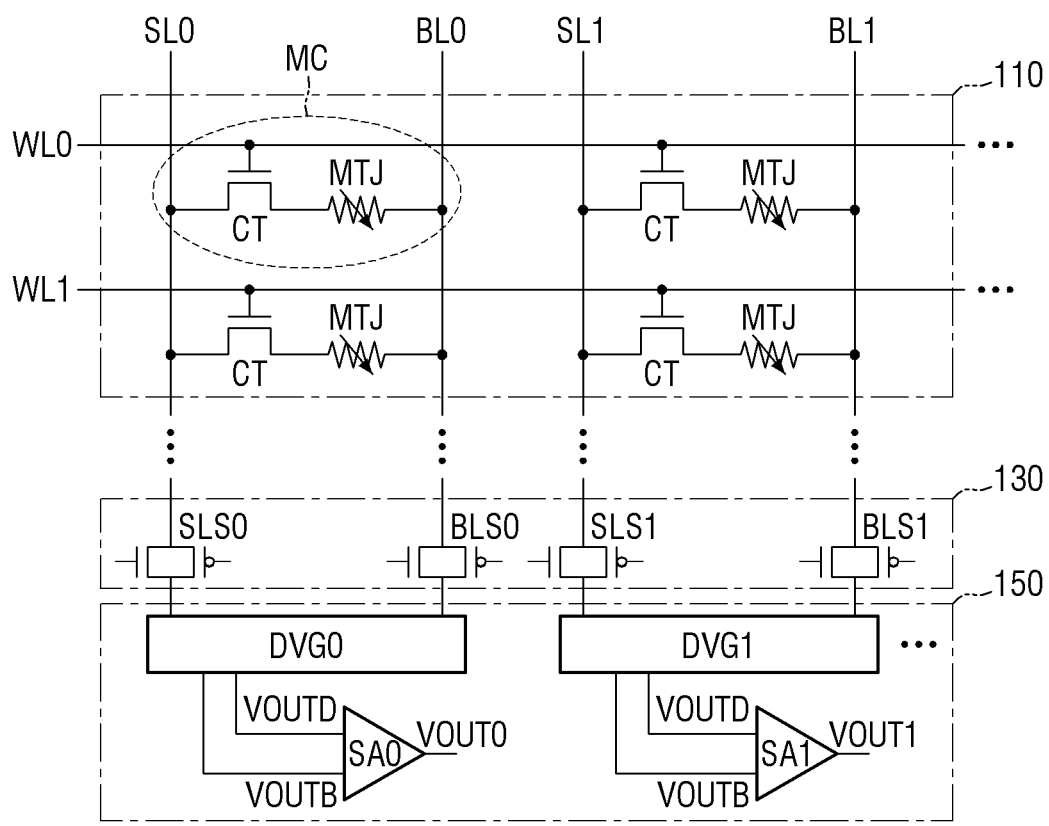
FIG. 6 is a circuit diagram of a nonvolatile memory device according to embodiments.

FIG. 6 is a circuit diagram of a nonvolatile memory device according to embodiments.

Referring to FIG. 6, the column selection circuit 130 may include a plurality of column selection elements SLS0, BLS0, SLS1, and BLS1, and the sensing circuit 150 may include a plurality of differential voltage generators DVG0 and DVG1 and a plurality of sense amplifiers SA0 and SA1.

The plurality of differential voltage generators DVG0 and DVG1 and the plurality of sense amplifiers SA0 and SA1 may serve as a read circuit for reading data stored in the memory cell MC disposed in a corresponding column.

The differential voltage generator DVG0 may generate a voltage VOUTD and a voltage VOUTB based on a current flowing through the memory cell MC connected to the source line SL0 and the bit line BL0.

After the column selection elements SLS0 and BLS0 are turned on, the differential voltage generator DVG0 may generate the voltage VOUTD and the voltage VOUTB based on a current flowing through the variable resistance element MTJ of the memory cell MC connected to a selected word line (e.g., WL0) among the memory cells MC connected to the source line SL0 and the bit line BL0.

Here, the voltage VOUTD and the voltage VOUTB may be differential voltages. When the voltage VOUTD increases by ΔV from a reference voltage VSS based on the current flowing through the variable resistance element MTJ, the voltage VOUTB may decrease by ΔV from a reference voltage VDD based on the current flowing through the variable resistance element MTJ.

The voltages VOUTD and VOUTB generated from the differential voltage generator DVG0 may be provided to the sense amplifier SA0, and the sense amplifier SA0 may compare the voltage VOUTD to the voltage VOUTB and generate an output voltage VOUT0.

When the data stored in the memory cell MC is a first data (e.g., "0"), the sense amplifier SA0 outputs a first voltage as the output voltage VOUT0, so that the sensing circuit 150 may read the data stored in the memory cell MC as the first data (e.g., "0"). Further, when the data stored in the memory cell MC is a second data (e.g., "1"), the sense amplifier SA0 outputs a second voltage as the output voltage VOUT0, so that the sensing circuit 150 may read the data stored in the memory cell MC as the second data (e.g., "1").

The differential voltage generator DVG1 may generate a voltage VOUTD and a voltage VOUTB based on a current flowing through the memory cell MC connected to the source line SL1 and the bit line BL1.

After the column selection elements SLS1 and BLS1 are turned on, the differential voltage generator DVG1 may generate the voltage VOUTD and the voltage VOUTB based on a current flowing through the variable resistance element MTJ of the memory cell MC connected to a selected word line (e.g., WL1) among the memory cells MC connected to the source line SL1 and the bit line BL1.

The voltages VOUTD and VOUTB generated from the differential voltage generator DVG1 may be provided to the sense amplifier SA1, and the sense amplifier SA1 may compare the voltage VOUTD to the voltage VOUTB and generate an output voltage VOUT1.

When the data stored in the memory cell MC is a first data (e.g., "0"), the sense amplifier SA1 outputs a first voltage as the output voltage VOUT1, so that the sensing circuit 150 may read the data stored in the memory cell MC as the first data (e.g., "0"). Further, when the data stored in the memory cell MC is a second data (e.g., "1"), the sense amplifier SA1 outputs a second voltage as the output voltage VOUT1, so that the sensing circuit 150 may read the data stored in the memory cell MC as the second data (e.g., "1").

Although only two source lines SL0 and SL1 and two bit lines BL0 and BL1 are shown in FIG. 6, the source lines and the bit lines may be provided in a larger number than those shown. In addition, the column selection elements, the differential voltage generators, and the sense amplifiers may also be provided in a larger number than those shown, corresponding to the number of the source lines and the bit lines.

Referring to FIG. 6, reference memory cells used to read the data stored in the memory cell MC are not provided between the memory cells MC arranged in the memory cell array 110. In the embodiments, the memory cells MC provided in the memory cell array 110 may be alternately arranged with the reference memory cells, for example, in the order of a first memory cell, a first reference memory cell, a second memory cell, a second reference memory cell, a third memory cell, and the like. Alternatively, the reference memory cells are not provided between the memory cells MC. Further, in the memory device according to the technical spirit of the disclosure, when reading data stored in the memory cells MC, data of the reference memory cells provided between the memory cells MC is not used.

Accordingly, the memory device according to the technical spirit of the disclosure may have a smaller size compared to a memory device in which the reference memory cell is provided between the memory cells MC. A method of reading data stored in the memory cell MC in the memory device according to the technical spirit of the disclosure will be described later.

Figure 7:
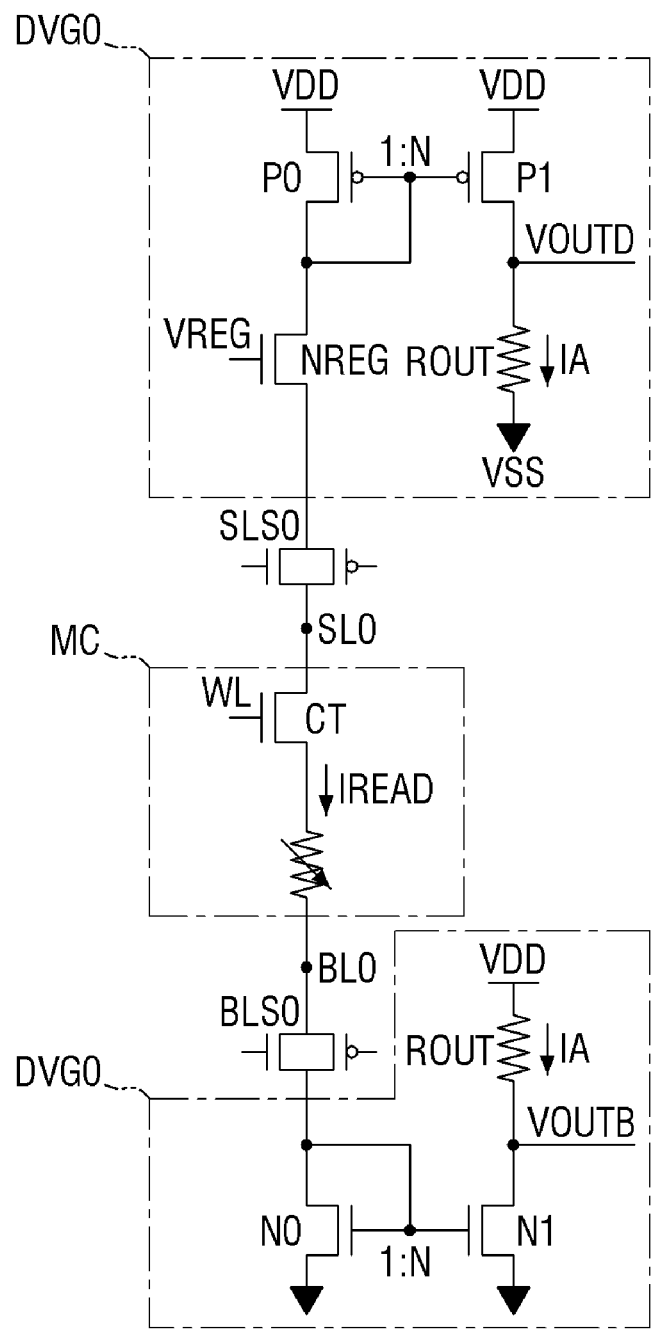
FIG. 7 is a detailed circuit diagram of FIG. 6.

FIG. 7 is a detailed circuit diagram of FIG. 6.

Hereinafter, the sensing circuit 150 will be described in more detail by exemplifying the differential voltage generator DVG0 connected to the source line SL0 and the bit line BL0. However, the following description may also be applied to another differential voltage generator (e.g., DVG1) included in the sensing circuit 150.

Referring to FIG. 7, the differential voltage generator DVG0 may include a first current mirror circuit and a second current mirror circuit.

The first current mirror circuit may include a transistor P0 and a transistor P1, and the second current mirror circuit may include a transistor N0 and a transistor N1.

The size of the transistor P1 may be N (N being a natural number) times the size of the transistor P0, and the size of the transistor N1 may be N times the size of the transistor N0.

The first current mirror circuit may be connected to the source line SL0, may mirror the read current IREAD flowing through the variable resistance element MTJ of the memory cell MC, and may amplify it N times to generate an amplified read current IA. In addition, a voltage VOUTD proportional to the amplified read current IA may be generated from the amplified read current IA and a resistor ROUT.

The voltage level of the voltage VOUTD may further increase from the voltage level of the reference voltage VSS as the magnitude of the read current IREAD increases. In embodiments, the reference voltage VSS may be, for example, a ground voltage, but embodiments are not limited thereto.

The second current mirror circuit may be connected to the bit line BL0, may mirror the read current IREAD flowing through the variable resistance element MTJ of the memory cell MC, and may amplify it N times to generate an amplified read current IA. In addition, a voltage VOUTB proportional to the amplified read current IA may be generated from the amplified read current IA and a resistor ROUT.

The voltage level of the voltage VOUTB may further decrease from the voltage level of the reference voltage VDD as the magnitude of the read current IREAD increases. In embodiments, the reference voltage VDD may be, for example, a power supply voltage having a voltage value greater than the ground voltage, but embodiments are not limited thereto.

The differential voltage generator DVG0 may include a transistor NREG. The transistor NREG may operate as a regulating transistor that adjusts the magnitude of the read current IREAD flowing through the memory cell MC according to a regulating voltage VREG provided to the gate electrode.

The transistor NREG may increase the read current IREAD as the regulating voltage VREG increases, and may decrease the read current IREAD as the regulating voltage VREG decreases.

Hereinafter, a data read operation of a nonvolatile memory device according to embodiments will be described with further reference to FIGS. 8 and 9.

Figure 8:
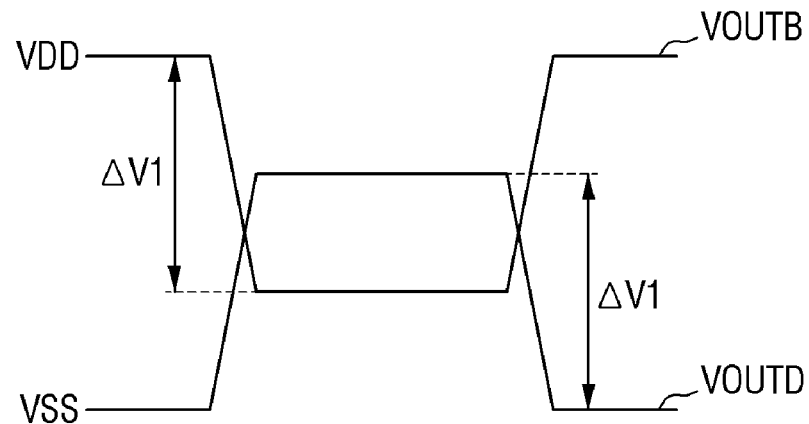
FIGS. 8 and 9 are diagrams for describing a data read operation according to embodiments.
Figure 9:
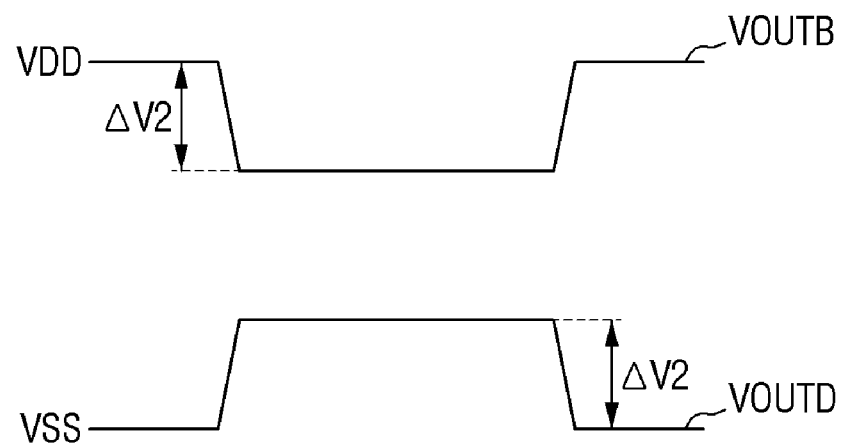

FIGS. 8 and 9 are diagrams for describing a data read operation according to embodiments.

First, referring to FIG. 7, in a read operation on the memory cell MC, a voltage VSL of the source line SL0 may be calculated as in the following Eq. 1:

$$VSL=VDD-VTHP-VDSN \qquad \text{Eq. 1}$$

where VTHP is a threshold voltage of the transistor P0, and VDSN is a threshold voltage of the transistor NREG.

In addition, in the read operation on the memory cell MC, a voltage VBL of the bit line BL0 may be calculated as in the following Eq. 2:

$$VBL=VTHN \qquad \text{Eq. 2}$$

where VTHN is a threshold voltage of the transistor N0.

As described above, due to the voltage difference between the voltage VSL of the source line SL0 and the voltage VBL of the bit line BL0, the read current IREAD may flow from the source line SL0 to the bit line BL0. The read current IREAD may flow from the source line SL0 to the bit line BL0 through the memory cell MC, and the magnitude of the read current IREAD flowing through the memory cell MC (the variable resistance element MTJ of the memory cell MC) may be calculated as in the following Eq. 3:

$$IREAD=(VSL-VBL)/(RMTJ+RCT) \qquad \text{Eq. 3}$$

where RMTJ is a resistance value of the variable resistance element MTJ, and RCT is a resistance value of the transistor CT.

That is, when the resistance value of the variable resistance element MTJ is small (e.g., when the variable resistance element MTJ has the low resistance value Rp and stores data "0"), the magnitude of the read current IREAD is large, and when the resistance value of the variable resistance element MTJ is large (e.g., when the variable resistance element MTJ has the high resistance value Rap and stores data "1"), the magnitude of the read current IREAD is small.

When ignoring a leakage current and the like, a current of the same magnitude as the read current IREAD flows through the transistor P0 and the transistor N0. The read current IREAD flowing through the transistor P0 and the transistor N0 may be mirrored and amplified N times by the current mirror circuit to be converted into the amplified read current IA.

Similarly to the read current IREAD, when the resistance value of the variable resistance element MTJ is small, the magnitude of the amplified read current IA is large, and when the resistance value of the variable resistance element MTJ is large, the magnitude of the amplified read current IA is small.

Therefore, when the variable resistance element MTJ of the memory cell MC has the low resistance value Rp (i.e., when "0" is stored in the memory cell MC), as shown in FIG. 8, the voltage VOUTD rises from the voltage level VSS to a voltage level pulled up by $\Delta V1$ (i.e., a pull-up signal is generated), and the voltage VOUTB falls from the voltage level VDD to a voltage level pulled down by $\Delta V'$ (i.e., a pull-down signal is generated).

Conversely, when the variable resistance element MTJ of the memory cell MC has the high resistance value Rap (i.e., when "1" is stored in the memory cell MC), as shown in FIG. 9, the voltage VOUTD rises from the voltage level VSS to a voltage level pulled up by $\Delta V2$ (i.e., a pull-up signal is generated), and the voltage VOUTB falls from the voltage level VDD to a voltage level pulled down by $\Delta V2$ (i.e., a pull-down signal is generated).

As described above, because the magnitude of the read current IREAD when the variable resistance element MTJ of the memory cell MC has the low resistance value Rp is greater than the magnitude of the read current IREAD when the variable resistance element MTJ of the memory cell MC has the high resistance value Rap, $\Delta V1$ is greater than $\Delta V2$.

Accordingly, when the variable resistance element MTJ of the memory cell MC has the low resistance value Rp, the difference between the voltage VOUTD and the voltage VOUTB has a positive value, but when the variable resistance element MTJ of the memory cell MC has the high resistance value Rap, the difference between the voltage VOUTD and the voltage VOUTB has a negative value.

Therefore, if the output voltage VOUT0 obtained by comparing the magnitudes of the voltage VOUTD and the voltage VOUTB in the sense amplifier SA0 (see FIG. 6) is a positive value, the sensing circuit 150 may read that "0" is stored in the memory cell MC, and if the output voltage VOUT0 obtained by comparing the magnitudes of the voltage VOUTD and the voltage VOUTB is a negative value, the sensing circuit 150 may read that "1" is stored in the memory cell MC.

As described above, in the nonvolatile memory device 100 according to the embodiments, when reading data stored in the memory cell MC, the data of the reference memory cell provided adjacent to the memory cell MC is not used. Accordingly, there is no need to arrange the reference memory cells between the memory cells MC, so that the size of the memory device may be reduced.

In addition, in the nonvolatile memory device 100 according to the embodiments, the voltage VOUTD and the voltage VOUTB, which are differential voltages, are generated from the read current IREAD flowing through the memory cell MC, and the data stored in the memory cell MC is read by comparing the magnitudes of the voltage VOUTD and the voltage VOUTB. Accordingly, the reliability of data reading (sensing) may be improved.

Figure 10:
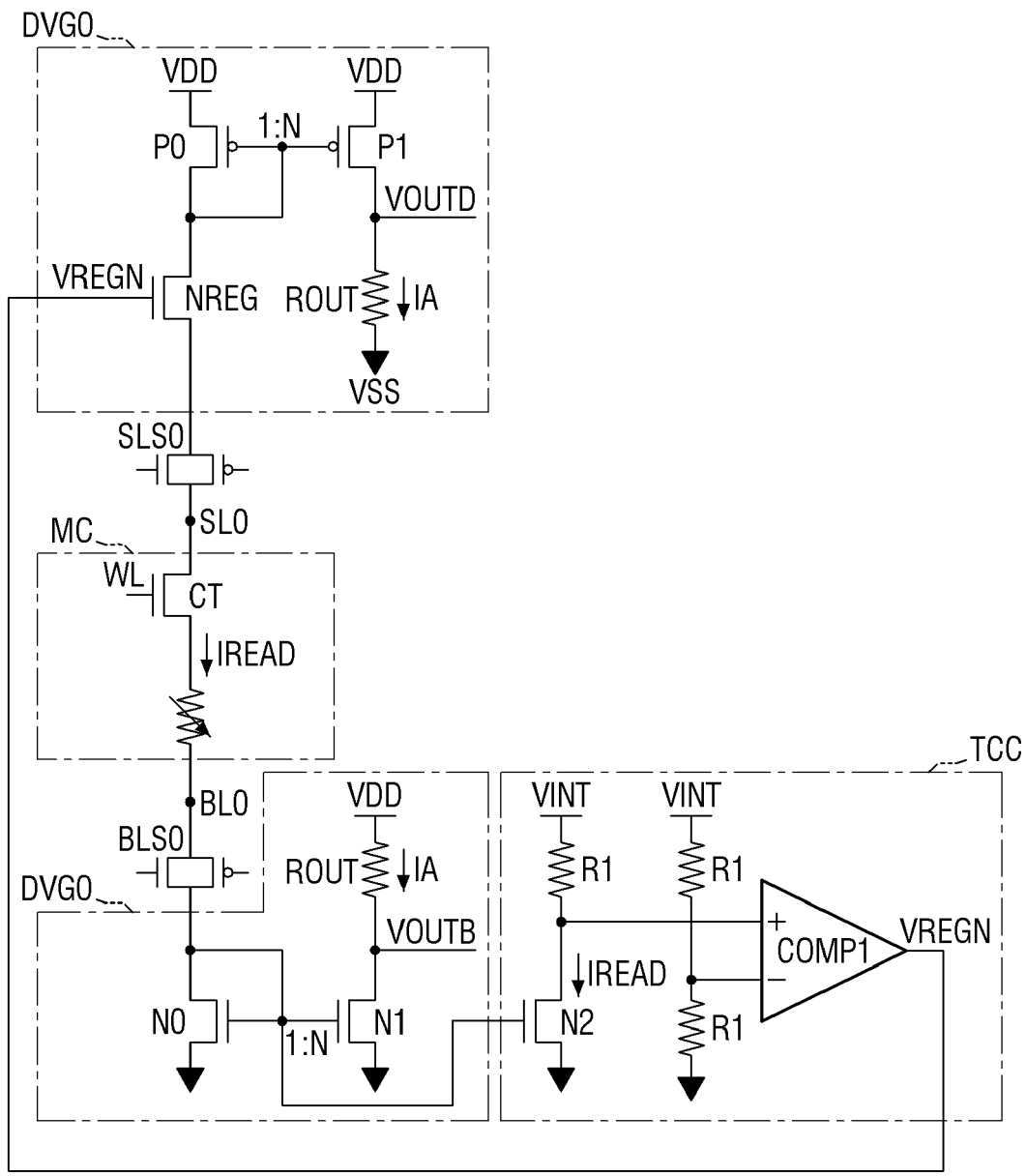
FIG. 10 is a circuit diagram of a nonvolatile memory device according to embodiments.
Figure 11:
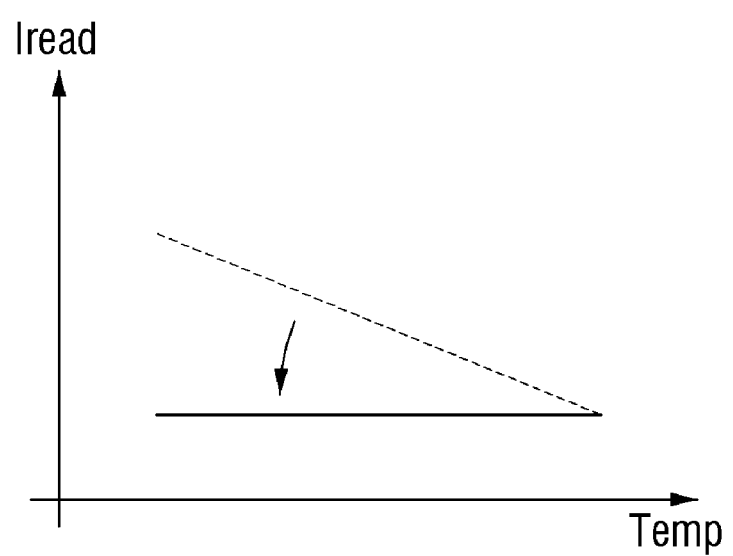
FIG. 11 is a diagram for describing an operation of the nonvolatile memory device of FIG. 10.

FIG. 10 is a circuit diagram of a nonvolatile memory device according to embodiments. FIG. 11 is a diagram for describing an operation of the nonvolatile memory device of FIG. 10.

The following description is mainly directed to differences from the above-described embodiments.

Referring to FIG. 10, a nonvolatile memory device 2 further includes a temperature compensation circuit TCC.

The temperature compensation circuit TCC may make the fluctuation amount of the read current IREAD, depending on a temperature change, equal to or less than a predetermined threshold value. The temperature compensation circuit TCC may generate a regulating voltage VREGN such that the fluctuation amount of the read current IREAD depending on a temperature change is equal to or less than the predetermined threshold value, and provide the regulating voltage VREGN to the sensing circuit 150.

The temperature compensation circuit TCC may include a transistor N2, a plurality of resistors R1, and a comparator COMP1 having, e.g., an OP AMP and the like.

One resistor R1 and the transistor N2 may be connected between a reference voltage VINT and the reference voltage VSS, and other two resistors R1 may be connected between the reference voltage VINT and the reference voltage VSS.

A positive input terminal of the comparator COMP1 may be connected between the one resistor R1 and the transistor N2, and a negative input terminal thereof may be connected between the other two resistors R1.

Here, a voltage having a constant magnitude may be provided from the reference voltage VINT regardless of temperature.

Referring to FIG. 11, the magnitude of the read current IREAD flowing through the variable resistance element MTJ of the memory cell MC may vary depending on the temperature (see the dotted line in FIG. 11). The read current IREAD may decrease as the temperature increases (see the dotted line in FIG. 11).

When the operating temperature changes rapidly due to a sudden change in the driving environment of the nonvolatile memory device 2, the voltage VOUTD and the voltage VOUTB may also rapidly change in magnitude, so it may be necessary to compensate for this phenomenon.

Referring to FIG. 10, a voltage by the read current IREAD whose value has changed depending on a temperature change, due to a transistor N2, is provided to the positive input terminal of the comparator COMP1. On the other hand, a voltage (e.g., VINT/2) independent of a temperature change is provided to the negative input terminal of the comparator COMP1.

When the voltage provided to the positive input terminal is greater than the voltage provided to the negative input terminal, the read current IREAD flows less compared to a reference value. Accordingly, the comparator COMP1 increases the regulating voltage VREGN (e.g., outputs a power supply voltage VCC), thereby increasing the magnitude of the read current IREAD flowing through the memory cell MC.

Conversely, when the voltage provided to the positive input terminal is smaller than the voltage provided to the negative input terminal, the read current IREAD flows more compared to the reference value. Accordingly, the comparator COMP1 decreases the regulating voltage VREGN (e.g., outputs a ground voltage), thereby decreasing the magnitude of the read current IREAD flowing through the memory cell MC.

According to the operation of the temperature compensation circuit TCC, as shown by the solid line in FIG. 11, in the read current IREAD flowing through the memory cell MC, the fluctuation amount of the read current IREAD depending on the temperature change may be equal to or less than a predetermined threshold value. Accordingly, data sensing reliability of the nonvolatile memory device 2 may be improved.

Figure 12:
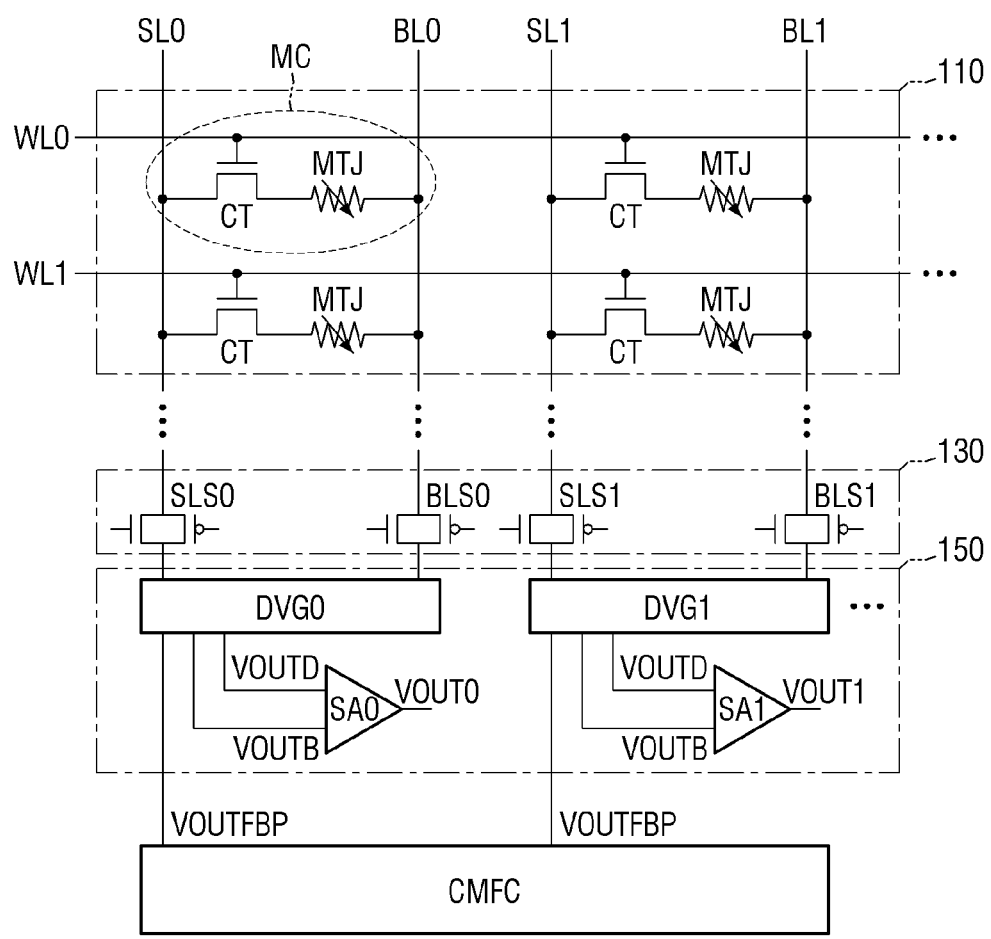
FIG. 12 is a circuit diagram of a nonvolatile memory device according to embodiments.
Figure 13:
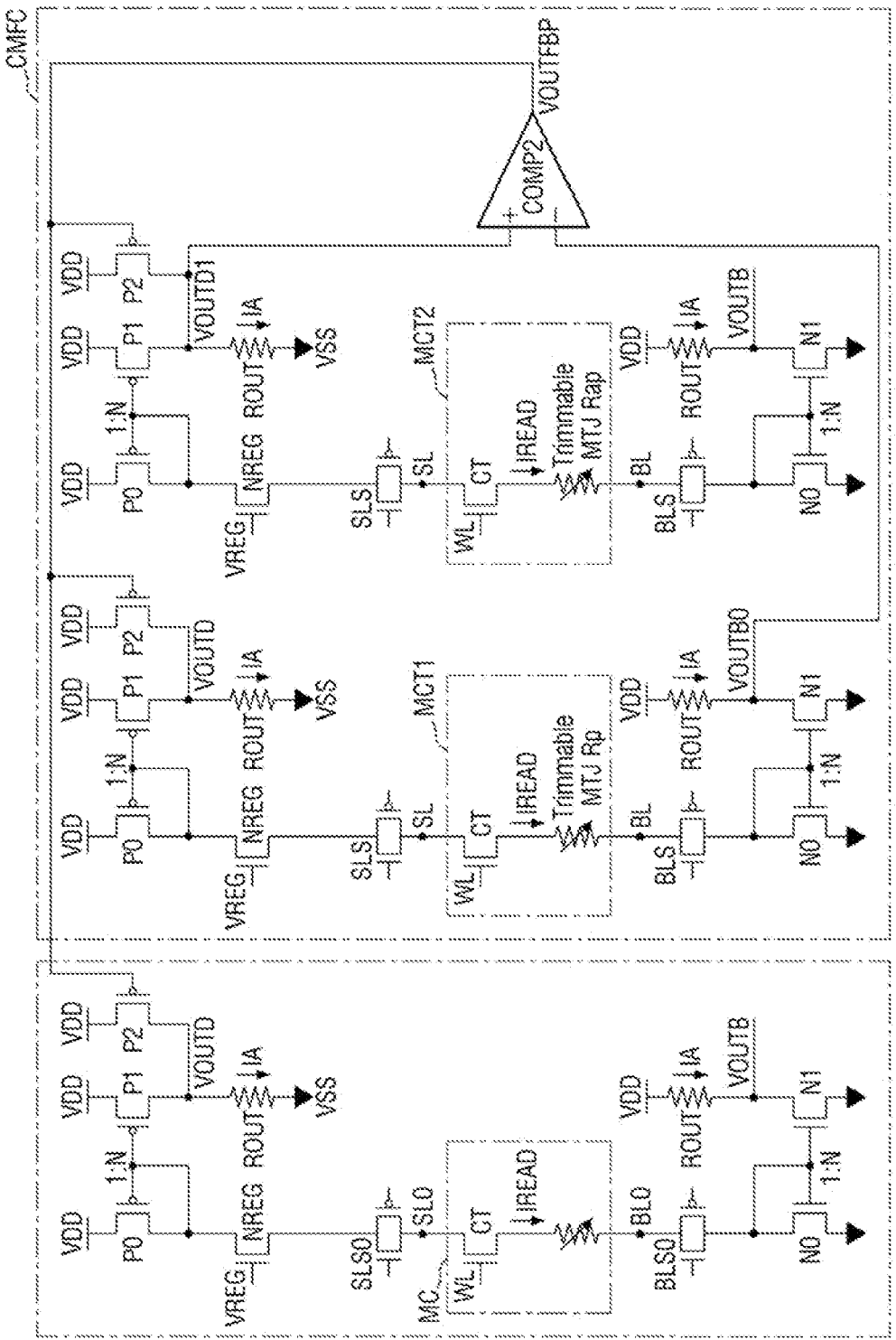
FIG. 13 is a detailed circuit diagram of FIG. 12.

FIG. 12 is a circuit diagram of a nonvolatile memory device according to embodiments. FIG. 13 is a detailed circuit diagram of FIG. 12.

Hereinafter, descriptions overlapping with the above-described embodiments may be omitted, and differences may be mainly described.

Referring to FIG. 12, a nonvolatile memory device 3 may further include a common mode feedback circuit CMFC.

The common mode feedback circuit CMFC may generate a feedback voltage VOUTFBP that enables the above-described sensing operation to be performed more reliably, and may provide the generated feedback voltage VOUTFBP to the sensing circuit 150.

In embodiments, the common mode feedback circuit CMFC may be disposed in a region in the nonvolatile memory device 3 that is not related to the memory cell array 110. In embodiments, the common mode feedback circuit CMFC may be employed as a part of the sensing circuit 150 and may be disposed separately from the sensing circuit 150.

Referring to FIG. 13, the common mode feedback circuit CMFC may include a comparator COMP2 including, for example, an OP AMP and the like.

The comparator COMP2 may receive a voltage VOUTB0 generated from the read current IREAD flowing through the variable resistance element MTJ trimmed to the low resistance value Rp of a trim memory cell MCT1 and a voltage VOUTD1 generated from the read current IREAD flowing through the variable resistance element MTJ trimmed to the high resistance value Rap of a trim memory cell MCT2, and then compare them.

Specifically, the voltage VOUTB0 generated from the read current IREAD flowing through the variable resistance element MTJ trimmed to the low resistance value Rp may be provided to the negative input terminal of the comparator COMP2, and the voltage VOUTD1 generated from the read current IREAD flowing through the variable resistance element MTJ trimmed to the high resistance value Rap may be provided to the positive input terminal of the comparator COMP2.

If the voltage VOUTD1 is smaller than the voltage VOUTB0, the comparator COMP2 outputs the ground voltage (e.g., "0") as the feedback voltage VOUTFBP to turn on a transistor P2 included in the differential voltage generator DVG0. Accordingly, the magnitude of the voltage VOUTD increases.

Conversely, if the voltage VOUTD1 is greater than the voltage VOUTB0, the comparator COMP2 outputs a power supply voltage (e.g., "1") as the feedback voltage VOUTFBP to turn off the transistor P2 included in the differential voltage generator DVG0. Accordingly, the magnitude of the voltage VOUTD does not increase any more.

Hereinafter, the operation of the nonvolatile memory device 3 according to the embodiments will be described in more detail with further reference to FIGS. 14 and 15.

Figure 14:
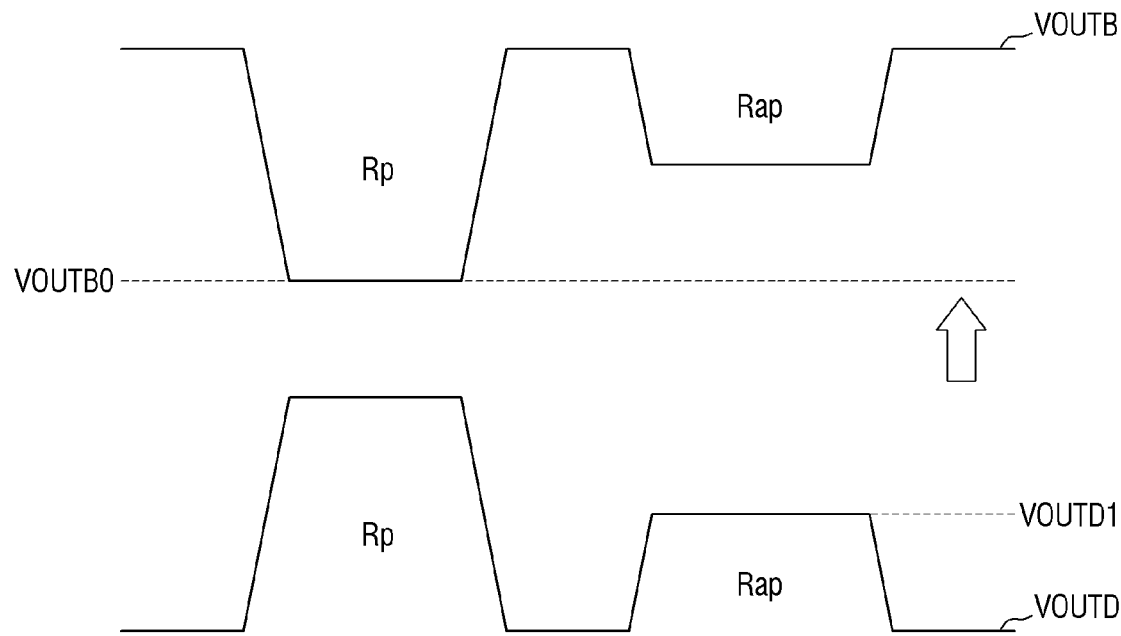
FIGS. 14 and 15 are diagrams for describing an operation of the nonvolatile memory device of FIG. 12.
Figure 15:
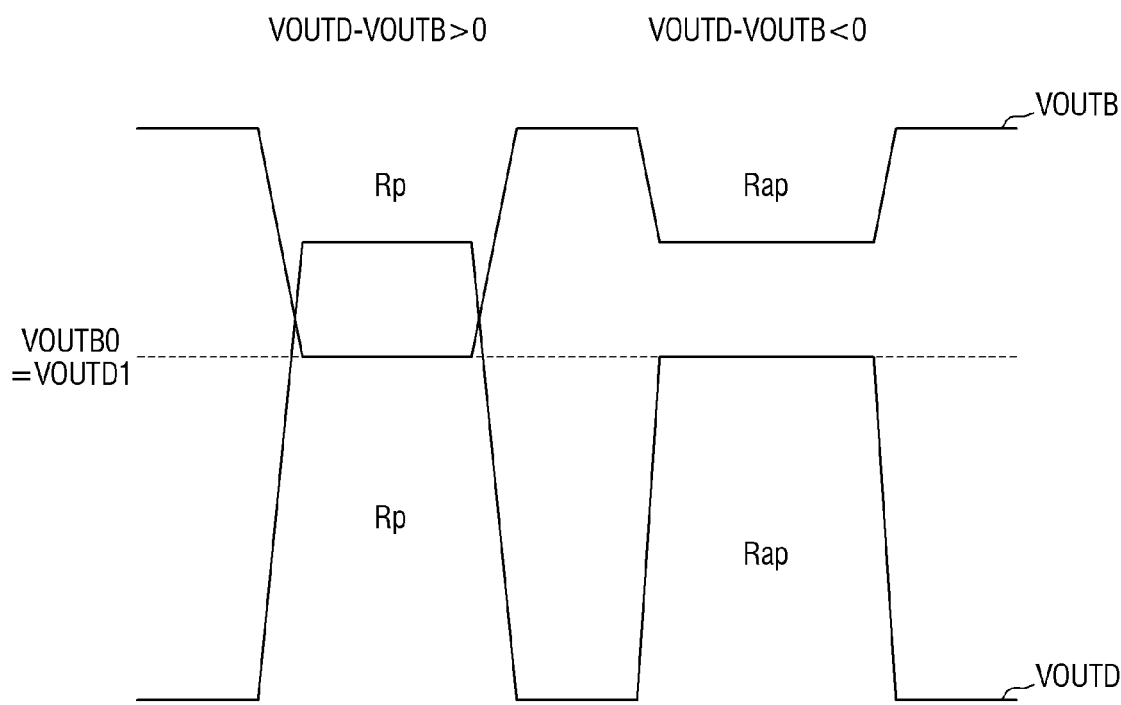

FIGS. 14 and 15 are diagrams for describing an operation of the nonvolatile memory device of FIG. 12.

As described above, in the nonvolatile memory device 3 according to the embodiments, if the output voltage VOUT0 obtained by comparing the magnitudes of the voltage VOUTD and the voltage VOUTB in the sense amplifier SA0 (see FIG. 12) is a positive value, the sensing circuit 150 reads that "0" is stored in the memory cell MC. If the output voltage VOUT0 obtained by comparing the magnitudes of the voltage VOUTD and the voltage VOUTB is a negative value, the sensing circuit 150 reads that "1" is stored in the memory cell MC.

However, due to a process variation in the manufacturing process of the nonvolatile memory device 3 or a serious change in operating conditions, if the value of ΔV1 in FIG. 8 decreases to allow the increased voltage level of the voltage VOUTD to become less than the decreased voltage level of the voltage VOUTB, or if the value of ΔV2 in FIG. 9 increases to allow the increased voltage level of the voltage VOUTD to become greater than the decreased voltage level of the voltage VOUTB, the reliability of data reading may be degraded.

Accordingly, the common mode feedback circuit CMFC may generate the feedback voltage VOUTFBP and provide it to the sensing circuit 150, thereby preventing such a malfunction in advance.

As shown in FIG. 14, the common mode feedback circuit CMFC may lower the voltage of the feedback voltage VOUTFBP (e.g., may output "0") when the voltage level of the voltage VOUTD1 generated from the read current IREAD flowing through the variable resistance element MTJ trimmed to the high resistance value Rap of the trim memory cell MCT2 is lower than the voltage level of the voltage VOUTB0 generated from the read current IREAD flowing through the variable resistance element MTJ trimmed to the low resistance value Rp of the trim memory cell MCT1. Accordingly, the transistor P2 is turned on to increase the voltage VOUTD1.

The common mode feedback circuit CMFC may, as shown in FIG. 15, repeat this process until the voltage VOUTD1 becomes equal to the voltage VOUTB0. When the voltage VOUTD1 becomes equal to the voltage VOUTB0, because the feedback voltage VOUTFBP outputted from the comparator COMP2 does not change any more, the voltage VOUTD1 stops increasing.

In this way, when the voltage level of the pull-down signal generated based on the read current IREAD flowing through the variable resistance element MTJ in which data "0" is stored is the same as the voltage level of the pull-up signal generated based on the read current IREAD flowing through the variable resistance element MTJ in which data "1" is stored, the reliability of the data read operation may be improved. Therefore, if the output voltage VOUT0 obtained by comparing the magnitudes of the voltage VOUTD and the voltage VOUTB in the sense amplifier SA0 (see FIG. 12) is a positive value, the sensing circuit 150 may read that "0" is stored in the memory cell MC, and if the output voltage VOUT0 obtained by comparing the magnitudes of the voltage VOUTD and the voltage VOUTB is a negative value, the sensing circuit 150 may read that "1" is stored in the memory cell MC.

In the above, only the embodiments in which the voltage level of the voltage VOUTD1 is increased according to the voltage level of the voltage VOUTB0 have been described, but the embodiments are not limited thereto. In embodiments, when the voltage level of the voltage VOUTD1 generated from the read current IREAD flowing through the variable resistance element MTJ trimmed to the high resistance value Rap of the trim memory cell MCT2 is lower than the voltage level of the voltage VOUTB0 generated from the read current IREAD flowing through the variable resistance element MTJ trimmed to the low resistance value Rp of the trim memory cell MCT1, the common mode feedback circuit CMFC may be modified and implemented to lower the voltage level of the voltage VOUTB0 by generating another feedback voltage.

In concluding the detailed description, those skilled in the art will appreciate that many variations and modifications may be made to the embodiments without substantially departing from the principles of the disclosure. Therefore, the embodiments of the disclosure are used in a generic and descriptive sense only and not for purposes of limitation.

What is claimed is:
1. A resistive memory device comprising:
a resistive memory cell;
a source line connected to one end of the resistive memory cell;
a bit line connected to another end of the resistive memory cell; and
a sensing circuit connected to the source line and the bit line, and configured to:
sense a pull-up signal that is pulled up from a first voltage level to a second voltage level, based on a read current flowing through the resistive memory cell;
sense a pull-down signal that is pulled down from a third voltage level to a fourth voltage level, based on the read current; and
determine data that is stored in the resistive memory cell, based on a difference between the sensed pull-up signal and the sensed pull-down signal,
wherein the sensing circuit comprises a current mirror circuit configured to amplify the read current, and
wherein the pull-up signal and the pull-down signal are sensed based on the amplified read current.

2. The resistive memory device of claim 1, wherein the resistive memory cell comprises a magnetic random access memory (MRAM) cell.

3. The resistive memory device of claim 2, wherein the read current flows from the source line to the bit line through the MRAM cell.

4. The resistive memory device of claim 1, wherein the sensing circuit is further configured to:
based on the sensed pull-up signal being greater than the sensed pull-down signal, determine the data stored in the resistive memory cell as first data; and
based on the sensed pull-down signal being greater than the sensed pull-up signal, determine the data stored in the resistive memory cell as second data different from the first data.

5. The resistive memory device of claim 4, wherein a resistance value of the resistive memory cell in which the first data is stored is less than a resistance value of the resistive memory cell in which the second data is stored.

6. The resistive memory device of claim 1, further comprising a temperature compensation circuit configured to provide a regulating voltage to the sensing circuit such that a fluctuation amount of the read current depending on a temperature change is less than or equal to a predetermined threshold value.

7. The resistive memory device of claim 1, further comprising a common mode feedback circuit configured to provide a feedback voltage to the sensing circuit such that the fourth voltage level of the pull-down signal sensed based on the read current flowing through the resistive memory cell in which first data is stored is the same as the second voltage level of the pull-up signal sensed based on the read current flowing through the resistive memory cell in which second data different from the first data is stored.

8. The resistive memory device of claim 7, wherein, based on the feedback voltage being provided to the sensing circuit, the pull-up signal is pulled up from the first voltage level to the fourth voltage level higher than the second voltage level.

9. A resistive memory device comprising:
a first resistive memory cell;
a second resistive memory cell;
a first source line connected to the first resistive memory cell;
a second source line connected to the second resistive memory cell;
a first bit line connected to the first resistive memory cell;

a second bit line connected to the second resistive memory cell;
a first sensing circuit connected to the first source line and the first bit line; and
a second sensing circuit connected to the second source line and the second bit line, wherein the first resistive memory cell and the second resistive memory cell share a word line,
wherein the first sensing circuit is configured to:
  sense a first pull-up signal that is pulled up from a first voltage level to a second voltage level, based on a first read current flowing through the first resistive memory cell;
  sense a first pull-down signal that is pulled down from a third voltage level to a fourth voltage level, based on the first read current; and
  determine first data that is stored in the first resistive memory cell, based on a first difference between the sensed first pull-up signal and the sensed first pull-down signal, wherein the first difference is positive or negative depending on whether the first read current is large or small, respectively, and wherein the second sensing circuit is configured to:
  sense a second pull-up signal that is pulled up from the first voltage level to a fifth voltage level, based on a second read current flowing through the second resistive memory cell;
  sense a second pull-down signal that is pulled down from the third voltage level to a sixth voltage level, based on the second read current; and
  determine second data that is stored in the second resistive memory cell, based on a second difference between the sensed second pull-up signal and the sensed second pull-down signal wherein the second difference is positive or negative depending on whether the second read current is large or small, respectively.

10. The resistive memory device of claim 9, wherein the first resistive memory cell comprises a first magnetic random access memory (MRAM) cell, and
wherein the second resistive memory cell comprises a second MRAM cell.

11. A resistive memory device comprising:
a magnetic random access memory (MRAM) cell;
a source line connected to one end of the MRAM cell;
a bit line connected to another end of the MRAM cell; and
a sensing circuit comprising:
  a first current mirror circuit connected to the source line, and configured to mirror a read current flowing through the MRAM cell to generate a first current; and
  a second current mirror circuit connected to the bit line, and configured to mirror the read current to generate a second current,
wherein the sensing circuit is configured to determine the data that is stored in the MRAM cell, using the generated first current and the generated second current,
wherein the first current mirror circuit and the second current mirror circuit are configured to amplify the read current, and
wherein a pull-up signal and a pull-down signal are sensed based on the amplified read current.

12. The resistive memory device of claim 11, wherein the first current is generated by amplifying the read current N times, N being a natural number, and
wherein the second current is generated by amplifying the read current the N times.

13. The resistive memory device of claim 11, wherein the sensing circuit is further configured to:
generate the pull-up signal, using the first current;
generate the pull-down signal, using the second current; and
determine the data stored in the MRAM cell, based on a difference between the generated pull-up signal and the generated pull-down signal.

14. The resistive memory device of claim 11, further comprising:
a regulating transistor connected to the first current mirror circuit and the MRAM cell; and
a comparator configured to:
  generate a regulating voltage by comparing a first voltage that is provided to a first input terminal of the comparator, with a second voltage that is provided to a second input terminal of the comparator, the first voltage changing according to the read current, and the second voltage being independent of the read current; and
  provide the generated regulating voltage to the regulating transistor.

15. The resistive memory device of claim 14, further comprising:
a first resistor connected between a first voltage terminal and the first input terminal;
a first transistor connected to the second current mirror circuit and connected between the first resistor and a second voltage terminal;
a second resistor connected between the first voltage terminal and the second input terminal; and
a third resistor connected between the second resistor and the second voltage terminal.

* * * * *